United States Patent [19]

Fraley

[11] 4,058,779
[45] Nov. 15, 1977

[54] TRANSISTOR OSCILLATOR CIRCUIT USING THERMAL FEEDBACK FOR OSCILLATION

[75] Inventor: Phillip Edward Fraley, Reading, Pa.

[73] Assignee: Bell Telephone Laboratories, Incorporated, Murray Hill, N.J.

[21] Appl. No.: 736,375

[22] Filed: Oct. 28, 1976

[51] Int. Cl.² .................. H03K 3/28; H05B 41/29
[52] U.S. Cl. ........................ 331/108 R; 315/246; 331/108 C
[58] Field of Search .......... 331/108 R, 108 C, 108 D; 307/310, 311; 315/246; 357/28

[56] References Cited

U.S. PATENT DOCUMENTS

| 3,258,606 | 6/1966 | Meadows | 331/108 R X |
| 3,393,328 | 7/1968 | Meadows et al. | 331/108 R X |
| 3,737,731 | 6/1973 | Zeewy | 331/111 |
| 3,766,444 | 10/1973 | Bosh | 357/28 |
| 3,870,971 | 3/1975 | Takahashi et al. | 331/108 D |
| 3,902,139 | 8/1975 | Harrell | 331/108 D |

*Primary Examiner*—Siegfried H. Grimm
*Attorney, Agent, or Firm*—Lester H. Birnbaum

[57] ABSTRACT

Disclosed is a monolithic oscillator circuit which relies upon the thermal characteristics of the semiconductor chip for oscillation. The circuit includes, in one embodiment, first and second transistors with similar output characteristics coupled to the input of a comparator element, and a third transistor coupled to the output of the comparator. The first and second transistors are unbalanced and the third transistor is placed close to only one of these transistors so that any heat generated will primarily affect the output of only the adjacent transistor. Thus, when a current flows from the comparator through the third transistor, the generated heat will decrease the potential across the first and second transistors until they are balanced, and the current through the comparator will shut off. The current remains off until the transistor cools off and an unbalanced condition is again achieved. The circuit may be integrated in a chip of small size and so is particularly suited for inclusion in light emitting diode packages.

9 Claims, 5 Drawing Figures

TRANSISTOR OSCILLATOR CIRCUIT USING THERMAL FEEDBACK FOR OSCILLATION

BACKGROUND OF THE INVENTION

This invention relates to oscillator circuits, and in particular to a monolithic oscillator circuit which may be integrated in a chip of small size.

In certain technologies, such as light emitting diode packaging, it is desirable to provide some means of pulsing the diode for greater efficiency. For example, it is known that the luminescent efficiency of green GaP, GaAsP or phosphor-coated GaAs diodes can be maximized by pulsing the diodes at a high current density and short duty cycle. Therefore, in applications where the diode will be powered by a D.C. potential, it is desirable to provide an oscillator circuit in series therewith.

The present state of the art includes many designs of oscillator circuits which usually include resistor-capacitor networks to achieve the proper frequency stability (see, e.g., U.S. Pat. No. 3,870,971 issued to Takahashi). Although conventional resistor-capacitor circuits may be used for this purpose, they cannot conveniently be made small enough to fit within the standard diode package.

It is therefore a primary object of the invention to provide an oscillator circuit capable of generating the appropriate pulse frequency which can be fabricated in a chip of small size.

SUMMARY OF THE INVENTION

These and other objects are achieved in accordance with the invention. The circuit relies upon the thermal characteristics of the chip rather than the electrical characteristics of a capacitor network to produce the oscillations. In one embodiment, first and second transistors with approximately equal output characteristics are coupled to the input of a comparator element. To the output of this element is coupled a third transistor which is placed relatively close to the first transistor and relatively distant from the second transistor. The first and second transistors are unbalanced to permit a current to flow through the comparator and the third transistor. The heat generated by the third transistor is transmitted to the first transistor thereby affecting the output until the two transistors become balanced and the current through the comparator is shut off. This non-conducting state continues until the first transistor cools sufficiently so that the first and second transistors are again in an unbalanced condition to permit current flow.

BRIEF DESCRIPTION OF THE INVENTION

These and other features of the invention are delineated in detail in the following description. In the drawing.

DETAILED DESCRIPTION OF THE INVENTION

The principles of the present invention are set forth with reference to the circuit diagram of FIG. 1. It will be appreciated that the precise circuit pattern and parameters given are those for an illustrative embodiment and many variations are possible.

The basic components of the circuit in accordance with this embodiment include the pair of transistors, $T_1$ and $T_2$ which are fabricated to have very similar output characteristics, i.e., the output voltages of the transistors are within 0.01 volts of each other for an equal input. The bases of the two transistors are coupled together to $R_2$, which in this example equals 2M, in order to electrically balance the transistors. However, means such as variable resistor $R_1$ is coupled in series with the input terminal 10 and the collector of transistor $T_1$ in order to increase the voltage of $T_1$ and thereby create a potential difference of $\Delta V$ across the transistor collectors when a dc potential is applied across terminals 10 and 11. (The variable resistance, $R_1$, was used here for experimentation, and in actual practice a resistor of fixed value would probably be used.)

The collector of transistor $T_2$ is coupled to input terminal 10 through resistor $R_4$ which in this embodiment is 0.236M.

The collectors of the two transistors are coupled to the input terminals, 13 and 14, of an operational amplifier used as a comparator element, 12, where plus and minus signs indicate the relative potential. The particular comparator element used in the present embodiment was that designated CA3060 manufactured by RCA. The details of this element can be found in RCA Linear Integrated Circuit Data Book, SSD-201C (1975) p. 312, which is incorporated by reference herein. Of course, other comparator elements known in the art may be utilized.

The output of the comparator is coupled to a heater element such as transistor $T_3$ through resistance $R_6$ and transistor $T_6$. The latter transistor is designed to provide additional gain to the signal, and the resistor, which in this example is 100K, controls the gain. The emitter of transistor $T_3$ is coupled to the ground terminal 11. The transistor $T_3$ is physically located near transistor $T_1$ but relatively distant from transistor $T_2$ and electrically isolated from both transistors $T_1$ and $T_2$. This feature will be described in more detail later.

Also included in the circuit are transistors $T_4$ and $T_5$ which constitute a "current-mirror" circuit. The bases of these transistors are coupled together and the collector of $T_5$ is coupled to the emitters of $T_1$ and $T_2$. The collector of $T_4$ is coupled to terminal 10 through resistance $R_3$ and both emitters are coupled to the ground terminal 11. This portion of the circuit is designed so that the current, $i_2$, through the branch constituting $T_4$ is equal to the sum of the currents $i_3$ and $i_4$ through the branches constituting, respectively, transistors $T_2$ and $T_1$.

Figure 1:
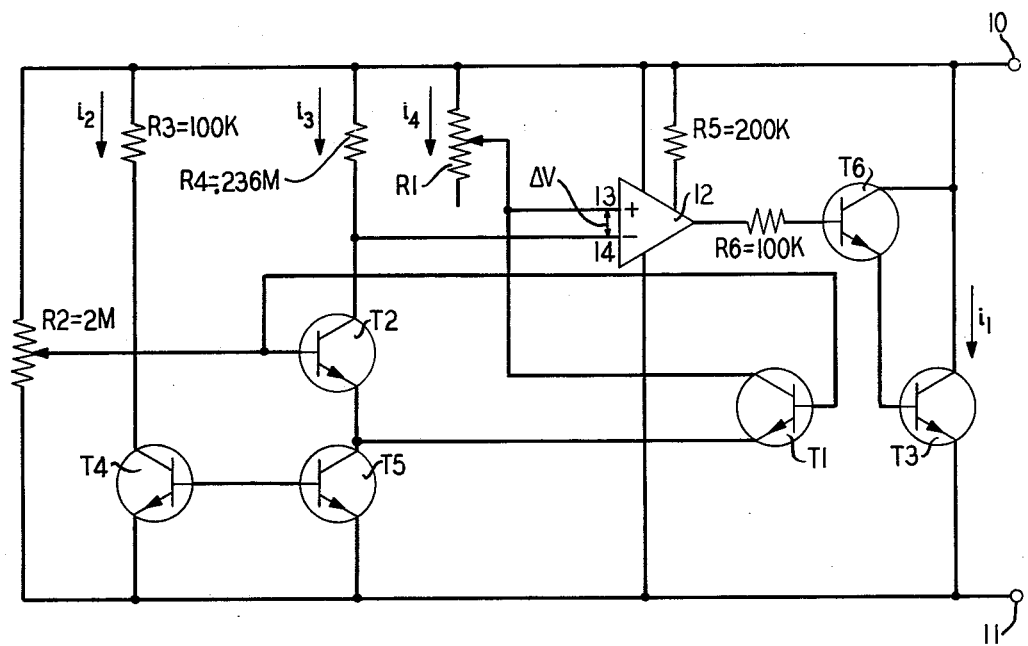
FIG. 1 is a circuit diagram in accordance with one embodiment of the invention.

The circuit of FIG. 1 was tested by coupling together two building block integrated circuit chips and the operational amplifier circuit chip. One chip included the transistors $T_1$, $T_2$, $T_3$ and the other building block included the remaining elements shown in FIG. 1.

In the operation of the circuit in accordance with FIG. 1, resistance $R_1$ was set at various values for unbalancing the transistors $T_1$ and $T_2$ so that when a dc potential of approximately 5 volts was applied at terminals 10 and 11, a potential difference ΔV was established at the input of comparators 12. This permitted a current $i_1$ to flow through the transistor $T_3$. In this example, the transistor $T_3$ was fabricated in the silicon chip approximately 5 mils from transistor $T_1$ and approximately 20 mils from transistor $T_2$. The current $i_1$ through transistor $T_3$ caused heat to be generated in the chip which was transmitted to transistor $T_1$ and not $T_2$ due to their relative distances from the transistor $T_3$. Since transistor $T_1$ had a positive temperature coefficient of approximately 3% per degree C, the base current rose until the voltage difference at the comparator input went to zero and the current from the comparator turned off ($i_1 = 0$). The current remained off until transistor $T_1$ cooled off to the point where there was again a sufficient potential difference, ΔV, to permit current to flow through the comparator and the transistor $T_3$. The cycle was then repeated.

Thus, the circuit can oscillate because the thermal capacitance and resistance of the silicon chip in the area of the heater transistor $T_3$ delays the temperature pulse to transistor $T_1$ and the electrical switching times of the circuit are many times faster than the thermal delay.

The difference in temperature of transistors $T_1$ and $T_2$ after one second was measured to be 45° C per watt. Since the power applied to the circuit was ¼ watt, the change in the output of $T_1$ was a maximum of 30 percent, which translated into a change of 0.04 percent per μm of separation between $T_1$ and $T_2$ for ¼ watt supplied. On the basis of these and other considerations, it is recommended that transistor $T_1$ be placed directly adjacent to $T_3$ (less than 1 mil distant), and $T_2$ be placed within a range of 5-30 mils from $T_3$. It would appear preferable for good thermal matching that $T_2$ be placed at a distance of approximately ten times the separation between $T_1$ and $T_3$.

Figure 2A:
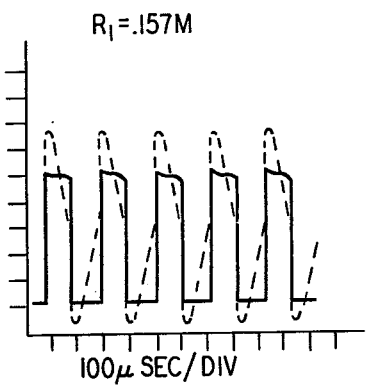
FIGS. 2A–2C are graphs illustrating the oscillations of a circuit in accordance with the same embodiment.
Figure 2B:
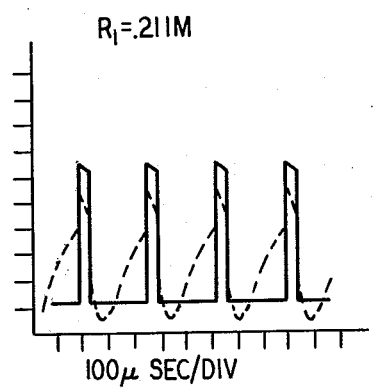
Figure 2C:
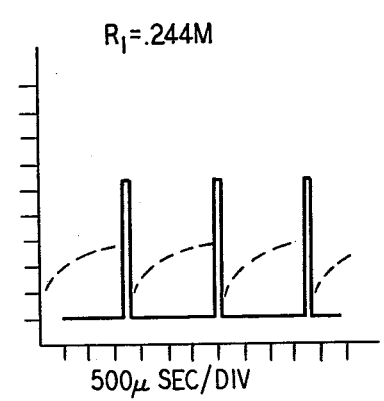

The results of operating the circuit of FIG. 1 are illustrated in FIGS. 2A-2C, each of which is a superposition of ΔV (broken lines) and $i_1$ (solid lines) as a function of time for a particular setting of $R_1$. The ordinate for ΔV is 10 mv per division, and for $i_1$ is 10 mA per division on the graphs. Thus, it can be seen that the frequency and duty cycle for these values of $R_1$ range from 600 Hz at 1.2% duty cycle ($R_1 = 0.244M$) to 4800 Hz at 50% duty cycle ($R_1 = 0.157M$). The spatial time delay is shown by the fact that ΔV decreases for a short time after the heater current turns off and increases for a short time after the heater current turns on.

These results also demonstrate that the circuit is particularly suited for pulsing a light emitting diode (LED). In such applications, it is desired to pulse the diode at currents in the range 50-500 mA but with a duty cycle which fixes the average LED current in the 10-30 mA range. A frequency in the range of 200-10,000 Hz for such applications is preferable. Since the present circuit requires no electrical capacitors, integration of a circuit meeting these requirements in a chip of less than 900 mil² is practical.

Figure 3:
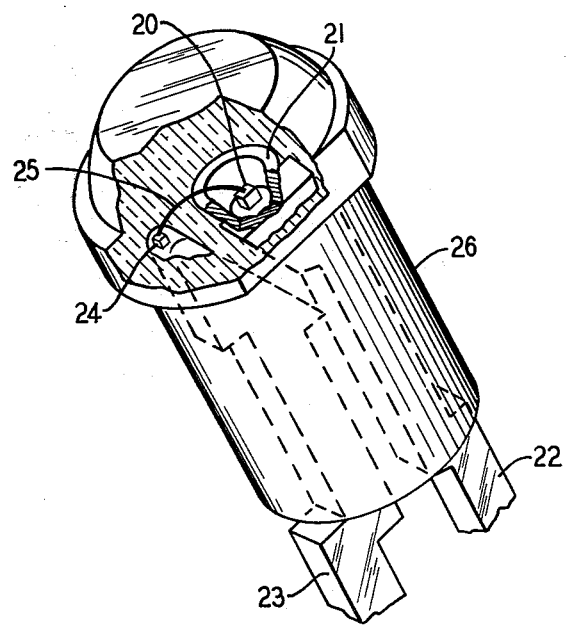
FIG. 3 is a perspective view of a light emitting diode package including the circuit in accordance with one embodiment of the invention.

A typical LED package employing the present circuit is illustrated in FIG. 3. The light emitting diode 20 is mounted in a reflecting pan 21 which is in turn bonded to lead frame terminal 22. On the other lead frame terminal 23 is bonded the semiconductor chip 24 which constitutes the integrated circuit of the present invention. The circuit is coupled in series with the LED by means of a wire connection 25. The assembly is encapsulated within cap 26 to protect the components from the environment. (It will be noted that a portion of the cap is cut away to reveal the circuit and LED, and the portion of the terminals hidden by the cap is shown in phantom.) It will be appreciated from this figure that an integrated circuit chip 24 included in the package must have extremely small dimensions. Preferably, the chip should have an area less than 900 mil².

It should be understood that although the specific embodiment described illustrates identical transistors $T_1$ and $T_2$ which are unbalanced by resistor $R_1$, the invention includes use of transistors with different output characteristics as long as they can be driven into a balanced condition by the thermal characteristics of the chip and transistors in the circuit.

Various additional modifications will become apparent to those skilled in the art. All such variations which basically rely on the teachings through which the invention has advanced the art are properly considered within the spirit and scope of the invention.

What is claimed is:

1. An oscillator circuit comprising:
   a comparator element having first and second inputs;
   first and second transistors coupled respectively to the first and second inputs of said comparator, said transistors being unbalanced so as to create a potential difference at the inputs of said comparator when a potential is supplied to said circuit thereby permitting a current to flow from the output of said comparator; and
   a heater element coupled to the output of said comparator, said element being placed sufficiently close to the first transistor and sufficiently distant from said second transistor such that heat generated by the element will affect the output of the first transistor in order to reduce the potential difference sufficiently to shut off any current from the comparator to the heater element.

2. The circuit according to claim 1 wherein the base and emitter regions of the first and second transistors are electrically coupled together and the circuit further comprises means for unbalancing the transistors comprising a resistor coupled to the collector region of the first transistor.

3. The circuit according to claim 1 wherein the heater element comprises a third transistor.

4. The circuit according to claim 2 further comprising a current mirror circuit comprising fourth and fifth transistors wherein the base and emitter regions are coupled together and the collector of one of said transistors is coupled to the emitter regions of the first and second transistors.

5. The circuit according to claim 3 wherein the third transistor is coupled to the output of the comparator through a sixth transistor which provides gain to the output of the comparator.

6. The circuit according to claim 3 wherein the first transistor is located less than 1 mil from the third transistor and the second transistor is located approximately 5 to 30 mils from the third transistor.

7. The circuit according to claim 1 wherein the average output current produced by the circuit is within the range 10-30 mA and the frequency of pulses is within the range 200 - 10,000 Hz.

8. A monolithic oscillator circuit formed in a silicon chip comprising:
   a comparator element having first and second inputs;
   first and second transistors having similar output characteristics coupled respectively to the first and second inputs of said comparator and having their base regions and emitter regions coupled in common;

a resistor coupled to the collector region of the first transistor to cause the first and second transistors to be unbalanced so that a potential difference is created at the inputs of the comparator when a potential is applied to the circuit;

a third transistor coupled to the output of the comparator and placed approximately ten times as far from the second transistor as the first transistor such that heat generated by the third transistor when current passes therethrough will affect the output of the first transistor in order to reduce the potential difference sufficiently to shut off any current from the comparator to the third transistor, said circuit thereby producing pulses with a frequency in the range 200 – 10,000 Hz and an average output current of 10–30 mA.

9. The circuit in accordance with claim 8 further comprising a discrete light emitting diode coupled in series with said circuit.

* * * * *